United States Patent [19]
Bielecki

[11] Patent Number: 5,754,048
[45] Date of Patent: May 19, 1998

[54] METHOD AND APPARATUS FOR PRECISELY CONTROLLING THE PERIODIC MOTION OF AN OBJECT

[75] Inventor: Anthony Bielecki, Wakefield, Mass.

[73] Assignee: Bruker Instruments, Inc., Billerica, Mass.

[21] Appl. No.: 682,143

[22] Filed: Jul. 17, 1996

[51] Int. Cl.$^6$ ................................................. G01V 3/00
[52] U.S. Cl. ................................................. 324/321; 324/322
[58] Field of Search ................................. 324/321, 322, 324/318, 314, 307, 309, 300

[56] References Cited

U.S. PATENT DOCUMENTS

| | | | |
|---|---|---|---|
| 4,739,270 | 4/1988 | Daugaard et al. | 324/300 |
| 4,752,737 | 6/1988 | Hlauka | 324/321 |
| 4,806,868 | 2/1989 | Schulke | 324/321 |
| 5,200,702 | 4/1993 | Lilly et al. | 324/321 |
| 5,236,239 | 8/1993 | Govang et al. | 294/86.4 |
| 5,237,276 | 8/1993 | Cory | 324/321 |
| 5,245,284 | 9/1993 | Burum et al. | 324/321 |
| 5,325,059 | 6/1994 | Doty | 324/321 |

OTHER PUBLICATIONS

Zhehong Gan. *Magic–Angle–Spinning Hopping NMR Spectroscopy*, Abstract MP 90, Experimental Nuclear Magnetic Resonance Conference, Pacific Grove, CA, Mar. 29, 1992.

Yi Jin Jiang et al., *An Efficient Variable Temperature Large Sample Volume Probe for Slow Spinning Solid State NMR Experiments*, Abstract MP 164, Experimental Nuclear Magnetic Resonance Conference, Pacific Grove, CA, Apr. 10, 1994.

Jian Zhi Hu et al., *2D Magic Angle Turning Experiment*, Abstract WP 224, Experimental Nuclear Magnetic Resonance Conference, Pacific Grove, CA, Apr. 10, 1994.

Wei Wang, et al. *A Simple Approach to Measure $^{13}C$ Chemical Shift Anisotropy in a Complex System with long $^1H\ T_1$*, Abstract WP 225, Experimental Nuclear Magnetic Resonance Conference, Pacific Grove, CA, Apr. 10, 1994.

Jian Zhi et al., *Multi–Dimensional Spectroscopy by Means of Magic Angle Turning Experiment*, Abstract WP 226, Experimental Nuclear Magnetic Resonance Conference, Pacific Grove, CA, Apr. 10, 1994.

David M. Grant et al., *Anisotropic Chemical Shift Measurements Using the Phase cORrected Magic Angle Turning (PHORMAT) Experiment*, Abstract WOaml 10:30, Experimental Nuclear Magnetic Resonance Conference, Boston, MA, Mar. 29, 1995.

Marielle Crozet, *Determination of Carbon–13 Hyperfine Couplings . . .*, Abstract P 342, Experimental Nuclear Magnetic Resonance Conference, Boston, MA, Mar. 29, 1995.

W. Wang et al., *Determining Solid State Conformation of 2–methoxydibenzofuran by Anisotropic $^{13}C$ Chemical Shift*, Abstract P 375, Experimental Nuclear Magnetic Resonance Conference, Boston, MA, Mar. 29, 1995.

Jian Zhi Hu et al., *An Isotropic Chemical Shift–Chemical Shift Anisotropy Magic–Angle Slow–Spinning 2D NMR Experiment*, Journal of Magnetic Resonance, Series A 105, pp. 82–87, 1993.

Jian Zhi Hu et al., *Magic–Angle–Turning Experiments for Measuring Chemical–Shift–Tensor Principal Values in Powdered Solids*, Journal of Magnetic Resonance, Series A 113, pp. 210–222, 1995.

*Primary Examiner*—Louis M. Arana
*Attorney, Agent, or Firm*—Kudirka & Jobse, LLP

[57] ABSTRACT

A method and apparatus precisely controlling the periodic motion of an object is specifically applicable to the control of the rotation of a nuclear magnetic resonance (NMR) spectrometer rotor, and uses a fluid source having a fluid output with a time-varying magnitude. The output of the fluid source is coupled to a stator housing within which the rotor is rotatably disposed such that the time varying fluid pressure from the fluid source impinges upon a plurality of vanes located about a circumference of the rotor. The coupling of the fluid flow to the rotor results in a periodicity of the rotor rotation being proportional to a periodicity of the time varying magnitude of the fluid flow. This, in turn, creates a plurality of stable equilibrium rotation rates at which a frequency locking effect is achieved that tends maintain the rotor periodicity at a predetermined rate, thereby achieving particularly precise and stable rotor rotation.

23 Claims, 10 Drawing Sheets

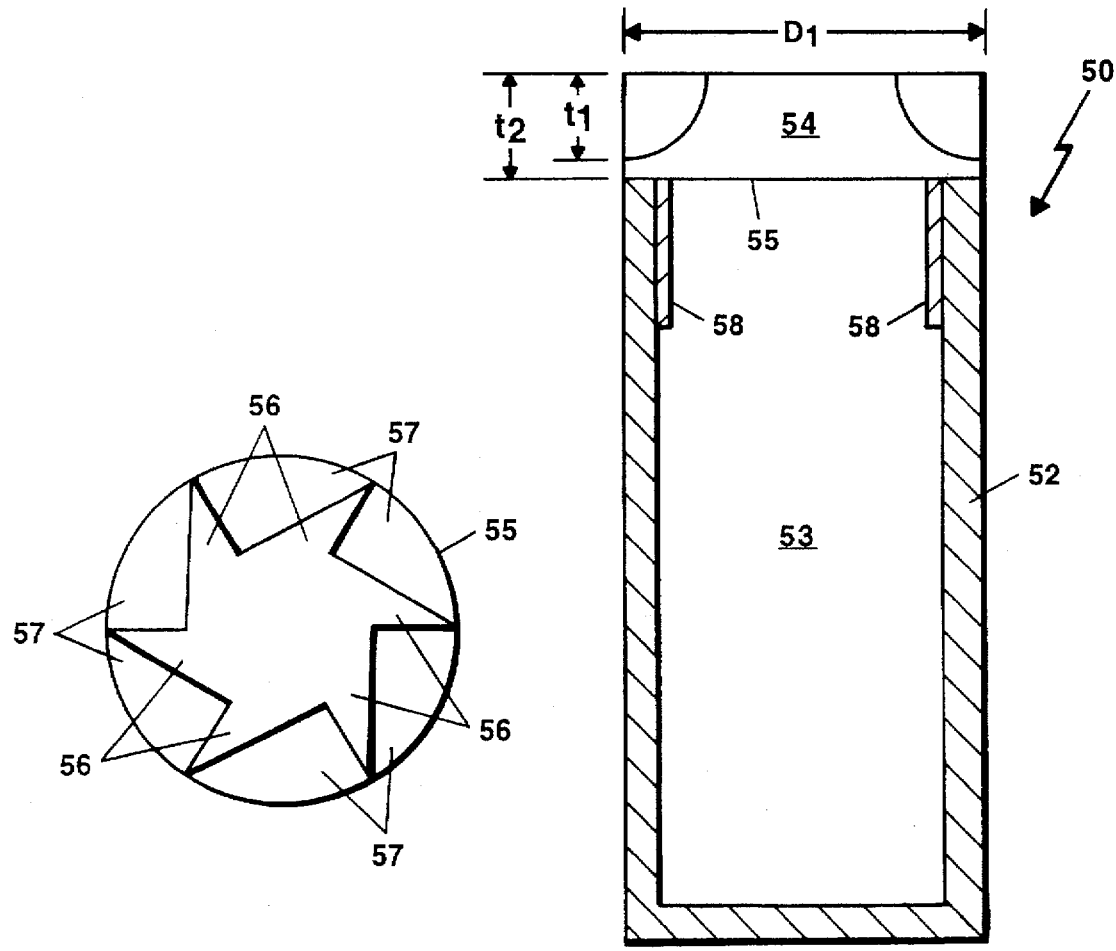
Figure 2A  Figure 2B

METHOD AND APPARATUS FOR PRECISELY CONTROLLING THE PERIODIC MOTION OF AN OBJECT

FIELD OF THE INVENTION

This invention relates generally to controlling the periodic mechanical motion of an object and, more particularly, to a method and apparatus for rotating sample materials during nuclear magnetic resonance (NMR) experiments.

BACKGROUND OF THE INVENTION

As is known in the art, a nuclear magnetic resonance (NMR) spectrometer is a device for measuring a spectral response of a sample material under test to applied static magnetic and radio frequency (RF) fields. As is also known, nuclear magnetic resonance (NMR) is a phenomenon exhibited by a select group of atomic nuclei generally referred to as "gyromagnetic" nuclei, and is based upon the existence in these nuclei of nuclear magnetic moments.

When a gyromagnetic nucleus is exposed to a relatively strong, uniform static magnetic field (a so-called "Zeeman Field") and perturbed by the magnetic field of a relatively weak radio-frequency (RF) signal, the gyromagnetic nucleus precesses at a resonant frequency generally referred to as the Larmor frequency. The Larmor frequency is characteristic of each nuclear type and is dependent upon the applied field strength in the location of the nucleus. The resonant frequencies of the nuclei can be observed by exposing the nuclei to a radio frequency (RF) signal pulse and measuring a time domain waveform corresponding to an amplitude of a component of a resultant magnetization vector which is transverse to the magnetic field over a predetermined period of time. The time domain waveform is typically converted to a frequency spectrum via Fourier transform techniques.

Although identical nuclei have the same frequency dependence upon the magnetic field, differences in the chemical environment of each nucleus can modify the applied magnetic field in the local vicinity of the nucleus, so that nuclei in the same sample do not experience the same net magnetic field. The differences in the local magnetic field between two such chemically non-equivalent nuclei result in spectral shifts in the Larmor frequencies generally referred to as "chemical shifts." Such chemical shifts reveal information regarding the number and placement of the atoms in a molecule as well as the positioning of adjacent molecules with respect to each other in a compound.

Unfortunately, it is not always possible to interpret the frequency spectra produced by the chemical shifts because of interfering and dominant molecular interactions. This is particularly true in NMR spectroscopy of solid material samples. In NMR testing of solid material samples, molecular interactions tend to obscure a desired output signal. For example, magnetic moments in neighboring nuclei may perturb each other, resulting in interactions called dipole-dipole couplings. These couplings tend to broaden the characteristic resonance peaks and obscure the sharply peaked spectral features typically produced by the chemical shifts.

An additional problem found in NMR testing of solid material samples is that the orientation of molecules which make up the solid material sample is relatively fixed with respect to the applied static magnetic field. This results in anisotropic chemical shifts since the resonant frequency depends, at least in part, on the physical orientation of the molecules with respect to the applied static magnetic field. To obtain a meaningful output signal, it is necessary, therefore, to suppress some molecular interactions over others.

In NMR testing of solid material samples for example, the aforementioned anisotropic chemical shift may typically be reduced by placing the solid material sample in a sample container having a central longitudinal axis aligned with respect to the applied static magnetic field at the so-called "magic angle" corresponding to an angle of 54° 44'. The sample container is provided with a plurality of vanes and flutes on a portion thereof, and is rotatably held at the magic angle in a housing, or "stator."

In conventional solid sample magic angle spinning (MAS) NMR, a steady flow of gas (i.e. a gas having a velocity which remains relatively constant at a particular point in space over time) is applied to the fluted portion of the sample container. The force exerted upon the fluted portion of the sample container by the steady gas flow causes the sample container and thus the solid material sample contained therein to rotate. For this reason, the sample container is commonly referred to as a "rotor." The steady flow of gas is applied to the rotor at a velocity which causes the rotor to rotate at a relatively constant predetermined rate of speed typically in the range of 2,000 to 15,000 rotations per second (rps).

During NMR measurements made while the rotor is rotating at such frequencies, anisotropic field components tend to average to zero. To select the particular rate at which the rotor spins (e.g. 6,000 rps) the velocity of the steady flow gas is adjusted to thus expose the fluted portion of the rotor to a predetermined relatively constant torque. At any instant in time, the resultant pressure on the fluted portion of the rotor corresponds to the force produced by the steady flow gas multiplied by the area of the region of the rotor which the steady flow gas impacts. As the rotor rotates, the steady flow gas will impact different regions of the fluted portion of the rotor which may result in minor variations in the pressure applied to the rotor by the steady flow gas.

As is also known, there exist certain two-dimensional nuclear magnetic resonance (NMR) techniques which utilize a rotor having disposed therein a solid material sample. One example is the so-called "magic angle turning" (MAT) experiment. In experiments of this type, it is required that the sample rotate at a precisely determined speed, typically less than 200 Hz, with the rotation axis aligned at the magic angle. These two-dimensional NMR techniques may be used to obtain frequency spectra of solid samples where the effects of anisotropic interactions are suppressed in one of the two dimensions. Thus, such two-dimensional NMR techniques provide the resolution required to separate different signal components in a first dimension while preserving anisotropic interactions in a second dimension.

Typically, to rotate the rotor at such relatively low frequencies, a rotor manufactured for the purpose of spinning at a relatively high rate of speed (e.g. at rotation frequencies typically in the range of about 2,000-15,000 Hz), is driven by a steady flow of gas which has a relatively low, constant pressure. The gas impacts vanes of the rotor, thereby causing the rotor to spin at a relatively low rate of speed (e.g. at rotation frequencies typically in the range of about 25–100 Hz).

One problem with this approach, however, is that it is relatively difficult to control precisely the rotation frequency of the rotor. The rotation frequency varies primarily due to an inability to adequately control the relatively low pressure steady flow gas. Furthermore, relatively large changes in the rotation frequency come about due to relatively small changes in the pressure of the gas. In addition, changes in the temperature of the gas cause changes in its relative density, correspondingly changing the force it provides. This, too, may cause a significant change in the rotation rate of the rotor.

Relatively elaborate schemes, generally referred to as rotor synchronization techniques, have been developed to adjust the timing of the NMR experiment to follow variations in rotor speed. A tachometer is used to provide a timing synchronization signal generally referred to as a "synchronization pulse" at equally spaced intervals during the rotation of the sample holder. For example, in the MAT experiment synchronization pulses are usually provided once for every 120 mechanical degrees of rotation. Thus, in this case, the tachometer provides three equally spaced pulses per complete revolution of the sample. The synchronization pulses are provided to a pulse generator or a timing controller where they are used to correctly time the generation of RF pulses.

It would be desirable to provide a technique for driving a rotor at a constant speed over a relatively wide range of rotor frequencies. It would also be desirable to provide a technique for spinning a rotor at a constant relatively low rotation frequency. It would also be desirable to provide a technique for performing a slow sample spinning NMR experiment which does not require rotor synchronization.

SUMMARY OF THE INVENTION

In accordance with the present invention, an apparatus for moving an object with a periodic motion includes a fluid source for providing a fluid flow having a time-varying magnitude, and means for coupling the object to the fluid flow such that the object undergoes the desired periodic motion. The time-varying magnitude of the source is such that a periodicity of the object is proportional to a periodicity of the fluid flow. While the preferred embodiment of the invention is directed to periodic rotational motion, the use of a time-varying fluid flow for generating periodic translational motion is also envisioned.

In one embodiment of the invention, the object undergoes periodic rotational motion and the fluid flow is a gas flow. The coupling between the rotational object and the gas flow comprises a direction of the gas flow toward a series of vanes located around a circumference of the object. Thus, the coupling strength is dependent upon the position of the object relative to the direction of the gas flow. In a particular embodiment, the rotating object is a sample container (or "rotor"), and holds a sample material for use with a magic angle turning probe.

In the preferred embodiment, the fluid source comprises an audio loudspeaker and a fluid conduit leading to the vanes of the rotor. The loudspeaker generates a time-varying acoustic signal which is coupled into the conduit as a confined time-varying fluid pressure. A timing signal circuit is used to generate a time varying electrical signal which is, in turn, used to drive the loudspeaker. The conduit through which the periodic fluid flow is directed may comprise one or more fluid paths. The periodicity of the fluid pressure is controlled by the periodicity of the electrical timing signal. In turn, the periodicity of the rotational motion of the rotor is proportional to the periodicity of the fluid flow.

The present invention is particularly well-suited for use with the slow spinning of a rotor for a magic angle turning (MAT) experiment. The coupling between the time-varying fluid flow and the rotor is such that a frequency locking effect results. This effect is such that deviations from an equilibrium rotation speed are opposed by a restorative torque, which keeps the rotor turning at a constant speed. This high degree of stability in the rotor speed, even at slow angular velocities, allows a higher degree of precision in MAT experiments.

BRIEF DESCRIPTION OF THE DRAWINGS

FIG. 2A is top view of an end cap of the rotor of FIG. 2.

FIG. 2B is cross-sectional side view of the sample container of FIG. 2.

DESCRIPTION OF THE PREFERRED EMBODIMENTS

Figure 1:
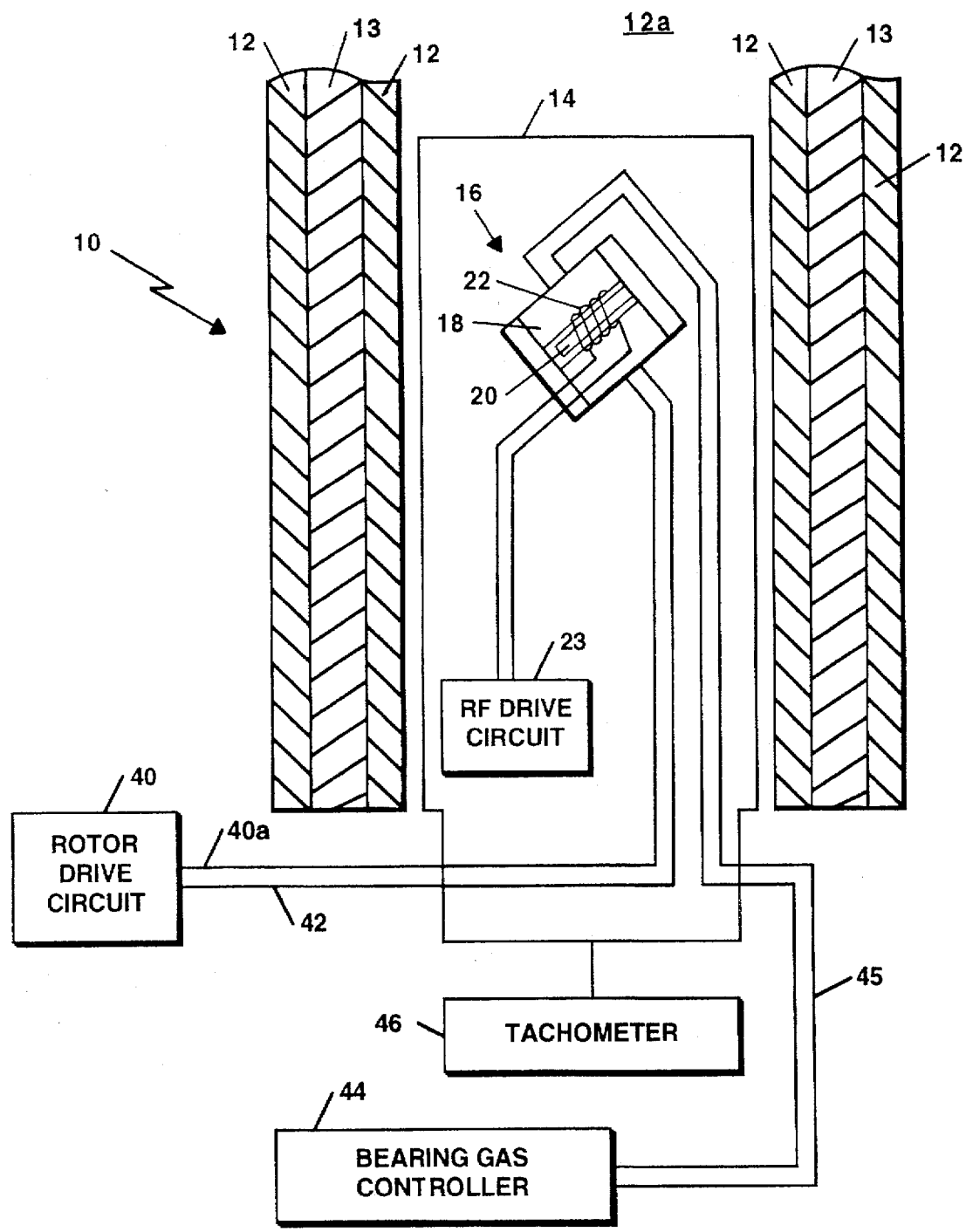
FIG. 1 is a schematic representation of an NMR spectrometer according to the present invention.
Figure 1A:
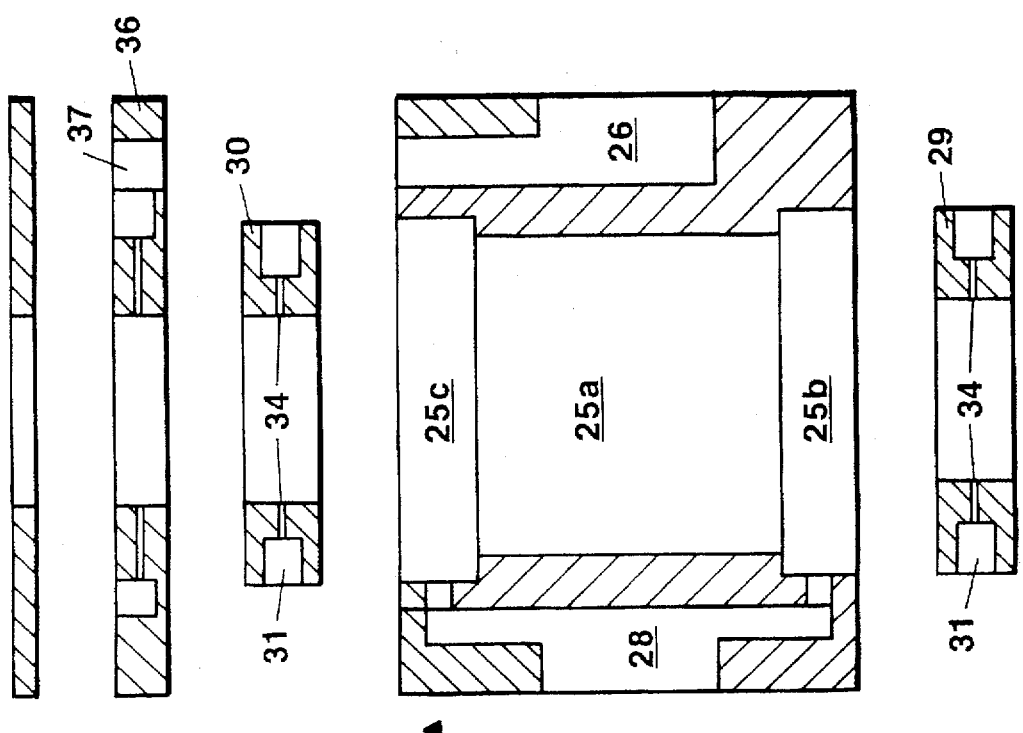
FIG. 1A is a partial, cross-sectional exploded view of a stator assembly of an NMR spectrometer according to the present invention.
Figure 1B:
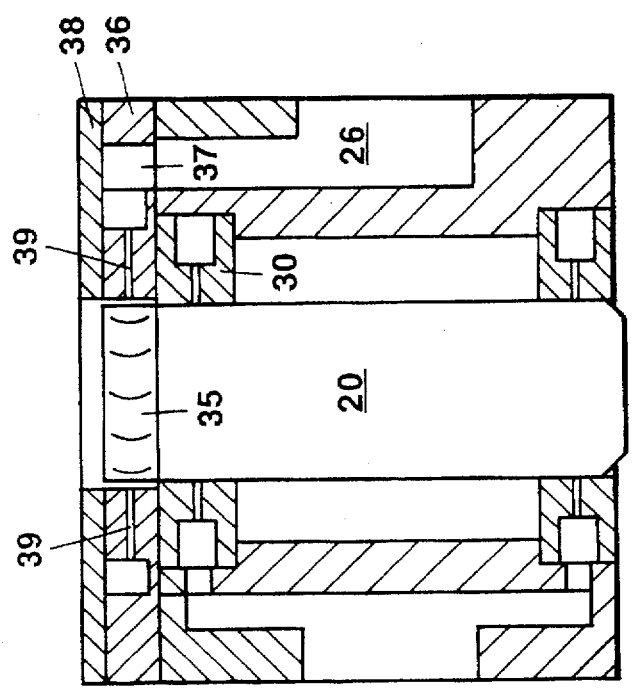
FIG. 1B is a partial, cross-sectional assembled view of the stator assembly of FIG. 1A.

Referring to FIGS. 1–1B in which like elements are provided with like reference designations throughout the several views, a nuclear magnetic resonance (NMR) spectrometer 10 for generating frequency spectra of a test sample includes a chamber 12 having disposed therein in a magnet 13. Chamber 12 and magnet 13 are each cylindrical in shape and a central portion of chamber 12 corresponds to an open region 12a.

A portion of a sample probe 14 is locatable within the open central region 12a of chamber 12. Probe 14 is described in further detail below, and is the type into which is disposed a sample material to be tested. Probe 14 includes a spinner assembly 16 which comprises a stator 18 in which may be located a sample container (or "rotor") 20. The sample material to be tested is deposited within rotor 20.

An RF coil 22 is disposed within the stator assembly 18, surrounding the sample container 20. An RF drive circuit 23 is coupled to first and second ends of the coil 22. A rotor drive circuit 40 provides at output port 40a a gas with a time-varying fluid pressure. The gas is applied to rotor 20 through a conduit 42. The gas generated by drive circuit 40 causes rotational motion of sample container 20 within the stator assembly 18.

In a preferred embodiment, drive circuit 40 generates at output port 40a a stream of gas which corresponds to a sequence of gas pulses. The gas stream is coupled from output port 40a to a drive gas inlet of the stator assembly 18 via a plurality of gas pathways including a gas tube 42. From tube 42, the gas is delivered through channels in the stator to rotor 20. Thus, rotor 20 is driven at a predetermined rotation frequency by a stream of varying pressure gas generated by drive circuit 40.

FIGS. 1A and 1B are partial cross-sectional views of stator assembly 18. Stator assembly 18 comprises a stator housing 24 having a cavity region there within. The cavity region includes a central portion 25a and first and second end portions 25b, 25c. Rotor 20, containing the sample material to be tested, is disposed in the cavity region 25a of stator housing 24. Also provided within housing 24 are a plurality of channels 26, 28. Disposed in the first end portion 25b of stator housing cavity 25 is a first or lower journal bearing 29 and disposed in the second end portion 25c of stator housing cavity 25 is a second or upper journal bearing 30.

Each of the lower and upper journal bearings 29 and 30 have channels 31 formed therein such that when the bearings 29, 30, are mated to stator housing 24, the bearing channels 31 align with stator housing channel 28 and gas introduced into stator housing channel 28 travels through the mating channels 31 and is forcefully expelled through apertures into the stator housing cavity. Thus, in this particular embodiment, the apertures form a plurality of gas jets 34.

The gas jets 34 are positioned such that when gas is introduced to channel 28, a gas stream emerges from each of the gas jets 34 and impacts rotor 20. The gas expelled through jets 34 provides an air bearing which supports the rotor 20 with a cushion of gas within the stator housing cavity.

As shown in FIG. 1B, rotor 20 has an end cap 35 coupled to a first end thereof. At least a portion of end cap 35 extends above upper journal bearing 30. Disposed over upper journal bearing 30 is a drive plate 36 having a plurality of channels formed therein. Adjacent to drive plate 36 is a drive plate cover 38 which terminates portions of the drive plate channels exposed through a top surface of drive plate 36. Drive plate 36 is located such that drive plate inlet channel 37 aligns with stator housing channel 26. With the channels 26, 37 thus aligned, gas introduced into channel 26 travels through the mating channels 26, 37 and is forcefully expelled through a plurality of apertures 39 as streams or jets of gas into the vicinity of rotor end cap 35. Thus, in this embodiment, each of the plurality of apertures 39 is referred to as a gas jet 39.

Gas jets 39 are positioned such that when gas is introduced through channel 26, the gas stream emitted through each of the plurality of gas jets 39 impacts end cap 35 of the rotor 20 in a manner discussed below. In response to the gas stream impacting the end cap 35, the rotor spins within cavity region 25 of stator housing 24. Since gas introduced to the stator cavity region 25 through gas jets 34 provides rotor 20 with a cushion of gas, the rotor spins within the stator cavity region 25 with relatively little resistance due to frictional forces which would otherwise occur from contact between the rotor 20 and the stator assembly 18.

Since a bearing gas is introduced to the rotor 20 via channel 28, channel 28 is referred to as bearing gas channel 28. Similarly, gas introduced into channel 26 provides a drive force to the rotor 20 and, thus, gas channel 26 is referred to as drive gas channel 26.

Referring again to FIG. 1 a bearing gas controller 44 provides a bearing gas at a regulated, relatively constant pressure to probe 14 via a gas conduit 45. The bearing gas is coupled through gas line 45 to the bearing gas channel 28. A tachometer 46 is coupled to spinner assembly 16 to detect the frequency of rotation of the rotor 20. Tachometer 46 may include, for example, a transducer such as an optical sensor which senses rotary motion of the rotor 20 and produces an electrical signal in response thereto. Tachometer 46 may also include an output display which displays the rotor rotation frequency.

In a preferred embodiment, a solid sample is disposed in the rotor 20 and the rotor 20 is placed in stator assembly 18. The stator is supported by a pair of pivots (not shown) within the probe 14 and secured at an angle which positions rotor 20 at 54° 44' with respect to an applied static magnetic field of the magnet 13. It is noted, however, that the present invention is not limited to solid samples or spinning at the "magic angle." Rather, the present invention may be used in spinning about any desired rotation axis.

An NMR test is conducted by spinning a sample material in the rotor 20, and exposing the spinning sample to the static magnetic field generated by magnet 13 and to a pulsed radio frequency (RF) field generated by exciting RF coil 22 via a series of RF pulses generated by RF drive circuit 23. The NMR response signal is detected in a known way, typically by induction in RF coil 22.

It should be noted that in some applications, it may be desirable to apply a force to rotor 20 by means other than by providing a gas flow to the rotor. In such applications, driver circuit 40 would provide a varying force of an appropriate type having an amplitude which varies as a function of time.

Figure 2:
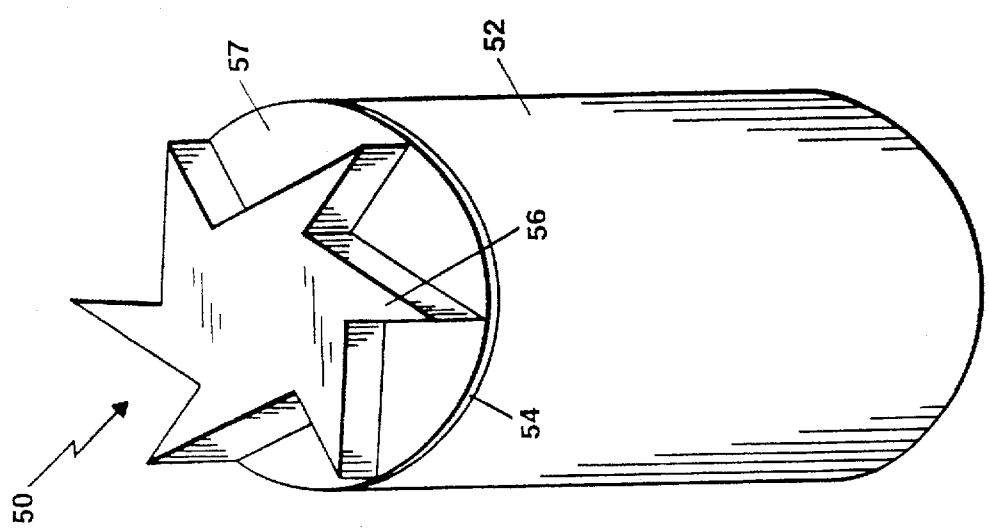
FIG. 2 is a perspective view of a rotor used with a spectrometer according to the present invention.

Referring now to FIGS. 2–2B, in which like elements are provided having like reference designations throughout the several views, a rotor 50 includes a cylindrically-shaped container 52 which is closed at one end and open at the other, and which has a cavity region 53 (FIG. 2B). In some applications the material samples may be solid while in others they may be liquid. Alternatively, the rotor itself may be a solid piece of sample material.

Disposed in the open end of container 52 is an end cap 54. End cap 54 includes a base region 55. End cap 54 has formed therein a plurality of flutes 57 and a corresponding plurality of vanes 56 projecting from base region 55. The flutes 57 may be formed in end cap 54 via machining or any other techniques. Alternatively, end cap 54 may be formed via injection molding techniques or any other desired construction technique.

Projecting from base region 55 of the end cap is an engagement member 58 which extends into the cavity region of the container 52. Engagement member 58 is cylindrical, and has a diameter which allows a press fit with an inner surface of container 52.

As described above in conjunction with FIG. 1, when rotor 50 is disposed in stator assembly 18 the vanes 56 of end cap 54 may be engaged by a gas stream expelled through drive gas jets 39. The drive gas causes the rotor 50 to rotate at a predetermined frequency.

In an alternative embodiment, a rotor may be provided having two open ends and corresponding end caps. Each of the end caps may or may not have vanes formed therein. In the case where neither end cap is provided with vanes, some portion of the rotor tube may be provided with vanes formed therein. Regardless of the manner in which the vanes are provided in the rotor, the rotor spins and responds to a stream of gas or other force impinging upon the vanes. In still another embodiment, the rotor can have a shape which is not cylindrical. For example, the rotor may have a conical or truncated conical shape. Alternatively still, a first portion of the rotor may have a conical shape while a second portion of the rotor has a cylindrical shape. Thus, it can be seen that there are a variety of different rotors which all have in common a portion with vanes to which a fluid drive force may be applied.

Figure 3:
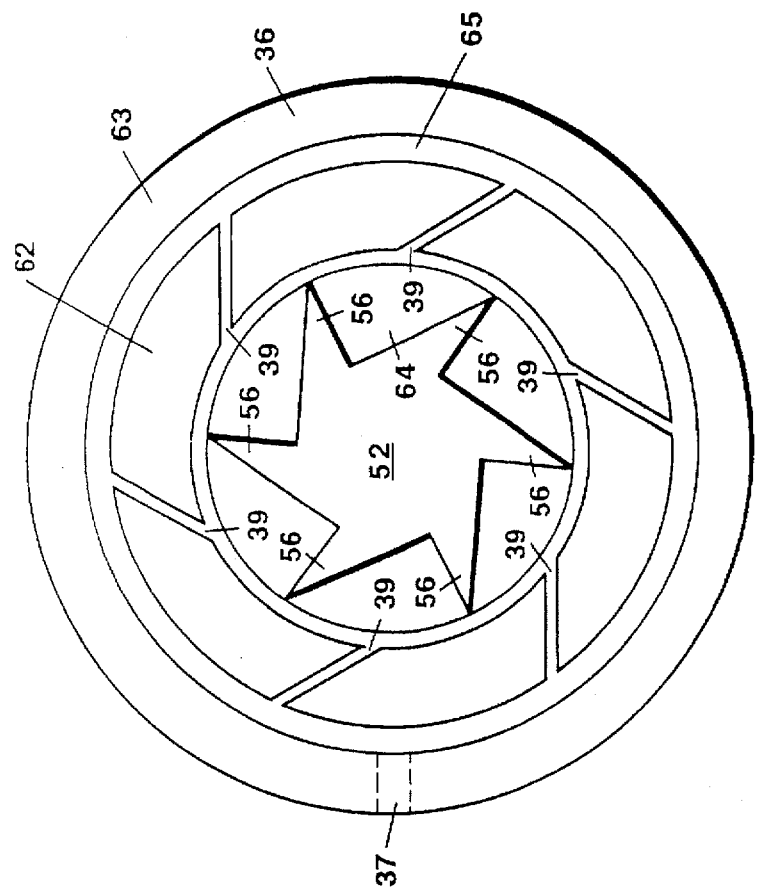
FIG. 3 is a cross-sectional top view of a rotor and stator for a spectrometer according to the present invention.

FIG. 3 is a cross-sectional top view of a stator and rotor assembly according to the present invention. Drive plate 36 has an inner ring 62 and an outer ring 63, and a central aperture region 64. Inner ring 62 is spaced from outer ring 63 by a predetermined distance to provide a drive gas distribution channel 65. The gas distribution channel 65 is in fluid communication with drive plate inlet channel 37. In this embodiment drive plate 36 has a single inlet 37. However, it may also be desirable to use a plurality of inlets 37.

Formed within inner ring 62 are gas jets 39. As gas is fed into the drive gas channel 26, it is forced through distribution ring 65 into gas jets 39. The gas jets conduct gas from the distribution ring 65 to central aperture region 64 of drive plate 36 in predetermined directions and at predetermined locations about the rotor end cap 52. There the gas impinges upon the vanes 56 of rotor end cap 52.

Different embodiments of the invention may include rotors with different diameters and different numbers of vanes on their end caps. Similarly, the number of gas jets may be varied. The particular number of drive gas jets provided in the drive plate and the particular number of vanes provided in the end cap may be selected in accordance with a variety of factors including, but not limited to, the desired range of rotation frequencies, the diameter of the rotor, the diameter of the drive plate, the diameter of each gas jet and the area and shape of the vanes.

There are also applications where unequally spaced drive gas jets and/or vanes may be advantageous. In such applications, the output of each drive jet may be timed relative to the anticipated angular position of the end cap. In such an embodiment, each drive gas jet would fire when one or another of the vanes was appropriately positioned relative to that particular jet. It should also be noted that the angle of the drive jets relative to the radius of the drive plate should be selected to provide a controllable force or gas pressure against the vanes of the rotor. Furthermore, the shapes of the vanes may be selected to optimize rotation at particular rotation frequencies.

Figure 5:
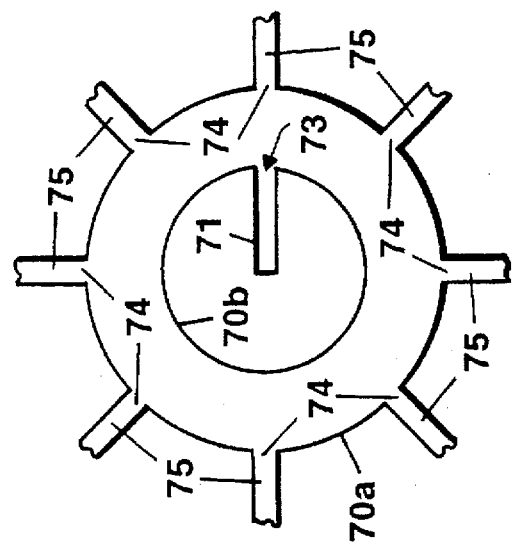
FIG. 5 is a cross-sectional top view of the valve of FIG. 4.
Figure 4:
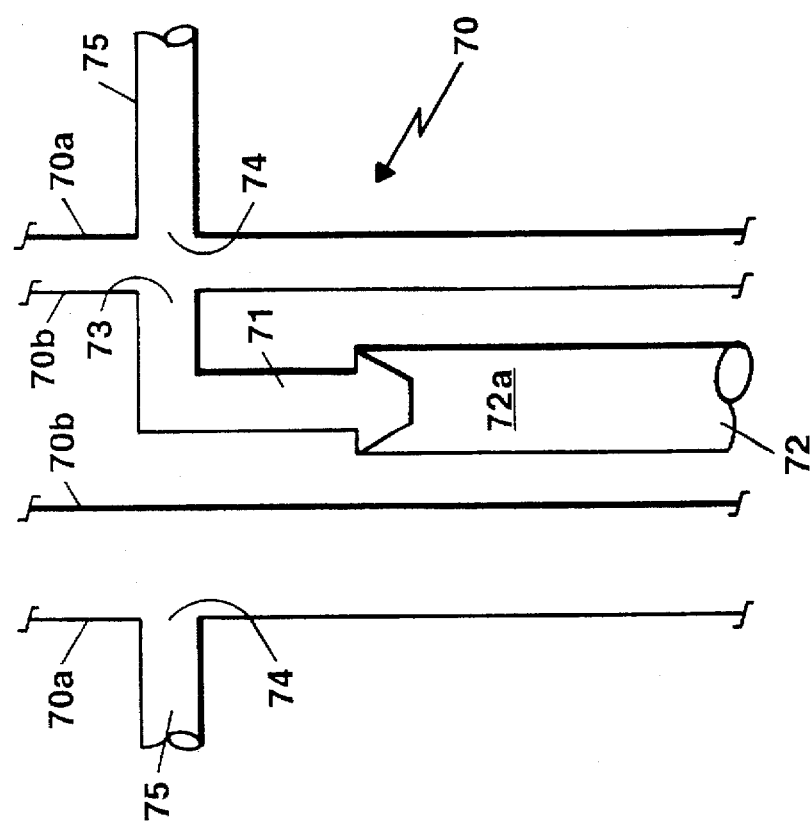
FIG. 4 is a cross-sectional side view of a fluid distribution valve according to the present invention.

The embodiment of FIGS. 1–3 provides a periodic gas flow to a plurality of drive jets via a common distribution channel 65. This results in the pulsing of gas from each of the jets 39 essentially simultaneously. However, it may be desirable to stagger the times at which gas is expelled from each of the jets. Referring now to FIGS. 4 and 5 in which like elements are provided having like reference designations, a valve 70 for expelling gas through gas jets at staggered times includes an outer sleeve 70a having disposed therein a rotatable inner sleeve 70b. Such a valve may be provided as part of a stator assembly, for example.

Inner sleeve 70b has a fitting 71 to which is coupled a first end of a tube 72. Fitting 71 leads to an aperture 73 in the inner sleeve 70b. A second end of tube 72 is coupled to a gas source (not shown) with a constant gas pressure. Outer sleeve 71a has provided therein a plurality of apertures 74, each located in a different angular position about outer sleeve 71a. Each of the apertures 74 leads to a tube 75 which connects to one of the drive gas inlets of a drive plate like that of FIGS. 1A, 1B and 3.

As inner sleeve 70b rotates within outer sleeve 70a, aperture 73 is progressively aligned with each of outer sleeve apertures 74. This allows a sequential distribution of a finite amount of gas to each of tubes 75. For example, with apertures 73 aligned as shown, gas provided by the gas source travels through tube 72 and fitting 71, through aperture 73, and into the tube 75 with which it is shown as being aligned. The gas stream then flows to a respective one of the plurality of gas inlets provided in the drive plate. The drive plate gas inlet leads to at least one drive gas jet in the drive plate, and the gas stream is forcefully expelled through that jet.

When inner sleeve 70b rotates further within outer sleeve 70a such that aperture 73 aligns with a different aperture 74, gas provided by the gas source travels through tube 72 and fitting 71, through aligned apertures 73 and into the tube 75 now aligned with the aperture 73. This gas stream then flows to a different one (or more) of the plurality of gas jets. Thus valve 70, acts as a firing control means, coupled between a gas flow generator and the drive gas jets, for distributing gas sequentially to a plurality of drive gas jets. This may be seen by the partial cross-sectional top view of FIG. 5, in which the tubes 75 are distributed about the outer sleeve 70a. (For clarity, only several of the tubes are shown in the drawing).

If the inner sleeve 70b is rotated at a constant rate, and the tubes 75 are equally distributed at angular positions about the outer sleeve, the firing of sequential gas jets is staggered, but equally spaced, in time. However, those skilled in the art will recognize that the relative angular locations of the gas jets, the arrangement of vanes on the rotor, the relative angular locations of the tubes 75 relative to the inner sleeve 70b, and the rate of rotation of the inner sleeve may all be varied to achieve almost any desired timing for the firing of the jets, and the corresponding impact on the rotor. Furthermore, other mechanisms for expelling gas through gas jets at staggered or differing times may also be used. For example, multiple gas stream sources may each be individually coupled to separate tubes each of which leads to a separate drive gas inlet of a drive plate. Such variations are considered to be well within the scope of the invention.

In one embodiment of the invention, a spinning system having two different drive components is provided. In such a system, the first drive component provides a steady gas stream, and spins the rotor at any desired frequency within some relatively wide range of rotation frequencies, but with limited frequency stability. The second drive component provides a pulsating gas stream which achieves a frequency lock at a desired rotation frequency, providing excellent frequency stability, but at a limited number of discrete frequencies. Each drive component in such a system could be optimized for its respective purpose and the combination of the two may provide a system which is able to accurately spin rotors at particular rotation frequencies within a wide range of desired rotor rotation frequencies.

Referring back to FIG. 3, the rotor end cap 52, having six equally spaced vanes 56, is driven by a gas flow emitted from six equally spaced drive gas jets 39. The drive gas jets apply a torque to the rotor, causing it to rotate. The drive torque on the rotor depends on the gas pressure provided to the drive gas jets 39 (the "drive pressure"). The drive torque may also depend on other factors such as the rotational velocity of the rotor (the "rotor speed"), and may be influenced by aerodynamic or acoustical effects. Thus, the instantaneous drive torque is difficult to predict. However, the time-varying pressure applied to the rotor provides a rotor speed regulation effect, which may be understood with the help of a simple mathematical model.

For the purposes of this model, the drive torque $T_D$ is defined as the product of the drive pressure $P_D$ and a "transfer coefficient" q that describes the dependence of the drive torque on the rotor angle. That is, $$T_D = P_D \cdot q$$

The transfer coefficient essentially defines the responsiveness of the rotor to the drive pressure. Because the drive gas jets strike respective vanes of the rotor at a distance and angle which varies according to the rotor angle, the transfer coefficient will have some angular dependence. For the purpose of this simple model, the angular dependence may be assumed to be in the form of a cosine. Thus, the transfer coefficient may be written as a periodic function of rotor angle:

$$q = q_0 + q_1 \cos(n\theta)$$

Similarly, the drive pressure, which is a periodic function of time, may be written as:

$$P_D = P_0 + P_1 \cos(\omega t)$$

where $P_0$ is a steady state pressure component, and $P_1 \cos(\omega t)$ is the time-varying pressure component. Therefore, the above representation of drive torque may be described as:

$$T_D = [P_0 + P_1 \cos(\omega t)] \cdot [q_0 + q_1 \cos(n\theta)]$$

The periodicity of the drive pressure is deliberately imposed by the time-varying gas source 40. The periodicity of the transfer coefficient is dependent on the periodic spacing of the vanes and the jets. For example, in the case of FIG. 3, the factor n=6.

The relative periodicities of the drive pressure and the transfer coefficient may be different under different conditions. However, one available periodicity relationship for the embodiment of FIG. 3 is that in which the periodicity of the drive pressure equals that of the transfer coefficient. The rotor speed required to accomplish this is referred to as the "nominal" speed. At this speed, the periodicities are coincident, such that the vanes 56 of the rotor pass successive jets 39 with the same frequency that the jets are firing. The nominal speed is equal to $\omega/n$. In mathematical terms, the coincidence of periodicities may be expressed as:

$$n\theta = \omega t + n\phi$$

where $\phi$ is referred to as the "rotor phase." If the rotor spins at exactly the nominal speed of $\omega/n$, then $\phi$ is a constant. If the rotor spins slightly faster or slower than the nominal speed, then $\phi$ gradually increases or decreases. By substitution, the previous drive torque equation becomes:

$$T_D = [P_0 + P_1 \cos(\omega t)] \cdot [q_0 + q_1 \cos(\omega t + n\phi)]$$

which may be evaluated to yield:

$$T_D = P_0 q_0 + P_0 \cdot q_1 \cos(\omega t + n\phi) + P_1 \cdot q_0 \cos(\omega t) + \tfrac{1}{2} P_1 q_1 \cos(n\phi) + \tfrac{1}{2} P_1 q_1 \cos(2\omega t + n\phi)$$

If the expression above is averaged over time, the time-averaged drive torque becomes:

$$T_{DAVG} = P_0 q_0 + \tfrac{1}{2} P_1 q_1 \cos(n\phi)$$

Finally, it may be assumed that there is a constant drag torque $T_{CD}$ which opposes the rotation of the rotor. The drag torque includes "mechanical load" in applications (such as motors) which derive power from the rotation. The rotor accelerates in response to the net torque exerted on the rotor, which is the difference between the drive torque and the drag torque. Averaged over time, this total torque is:

$$T_{NET} = P_0 q_0 + \tfrac{1}{2} P_1 q_1 \cos(n\phi) - T_{CD}$$

Figure 6:
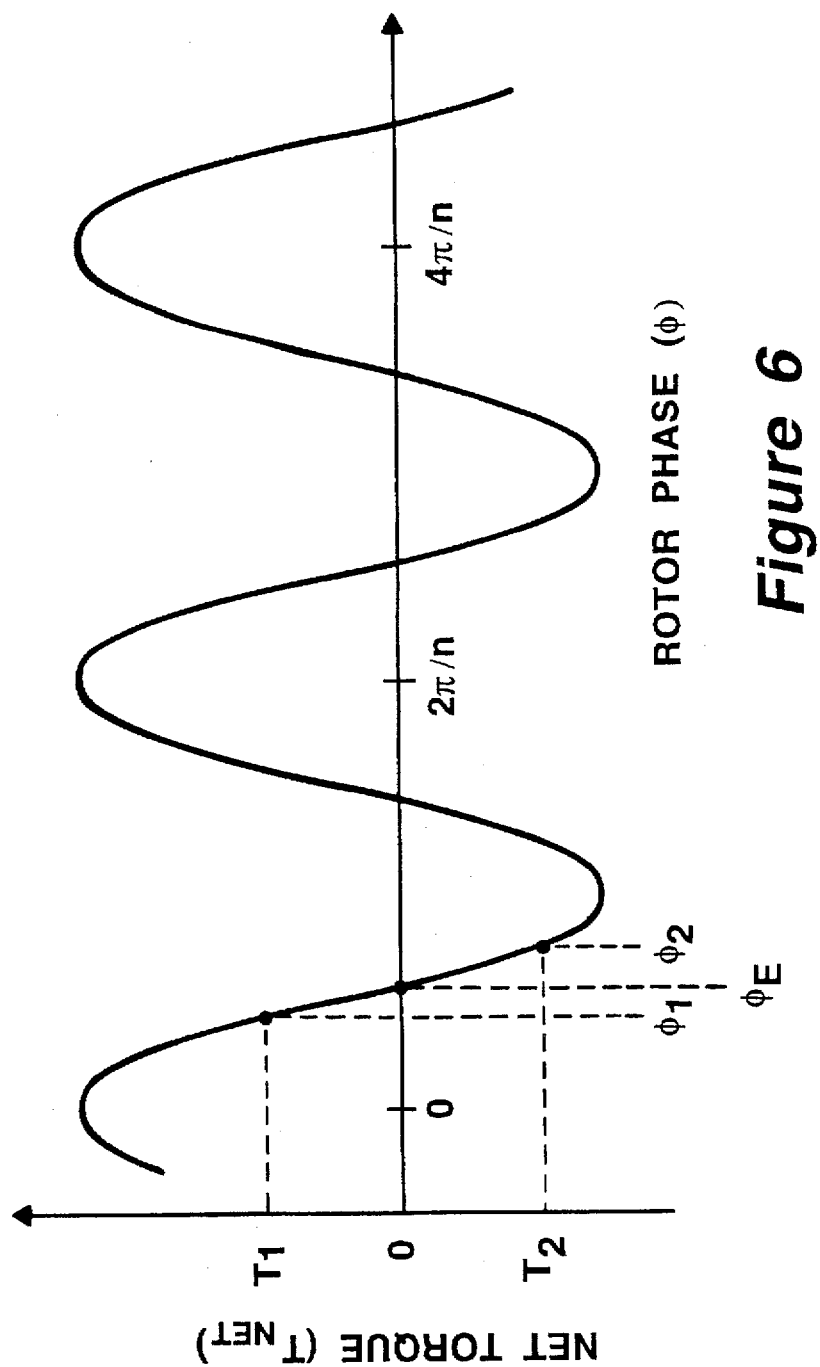
FIG. 6 is a plot of torque versus phase angle of the rotor for a spectrometer according to the present invention.

FIG. 6 is a plot of this torque as a function of rotor phase $\phi$. It is a periodic function, with a range from $P_0 q_0 - \tfrac{1}{2} P_1 q_1 - T_{CD}$ to $P_0 q_0 + \tfrac{1}{2} P_1 q_1 - T_{CD}$. For any given rotor phase, there is a corresponding average net torque. When the torque is positive, the rotor accelerates, which tends to cause $\phi$ to increase. As $\phi$ increases, there is a corresponding change in the torque. Similarly, when the torque is negative, the rotor decelerates, which tends to cause $\phi$ to decrease and, again, results in a corresponding change in the torque.

As shown in FIG. 6, there may be points at which the torque is equal to zero. With zero torque, the rotor does not accelerate or decelerate. At these points, the rotor speed is constant, and they are therefore referred to as equilibrium points, and any corresponding rotor phase as an equilibrium phase. When a rotor spins at the nominal speed, and at an equilibrium phase, it will continue spinning at that same speed. The equilibrium points which are situated on a positive slope are referred to as unstable, since small deviations of the rotor phase result in a torque which causes the phase to deviate even further. The equilibrium points which are situated on the negative slope, however, are referred to as stable, since small deviations of the rotor phase result in a torque which causes the phase deviation to decrease. Therefore, in the vicinity of a stable equilibrium point, the rotor tends to remain near the equilibrium phase. A further consequence of operating at the stable equilibrium is that the rotor speed tends to remain near the nominal speed.

Referring to FIG. 6, when a rotor rotates at the nominal frequency, the net torque generated at a particular stable equilibrium phase angle $\phi_E$ is equal to zero. In the vicinity of a stable equilibrium, the net torque $T_{NET}$ maintains the rotor spinning at the nominal frequency. If the rotor spins at a higher or lower frequency than the nominal frequency, then the rotor would be provided with either a negative or positive torque. For example, if the rotor began spinning slower than the nominal rotation frequency, then the rotor phase would fall back to $\phi_1$. With the rotor at phase angle $\phi_1$, the net torque on the rotor would be a positive value $T_1$. This positive torque would cause a corresponding rotational speed increase, the rotor would eventually return to the nominal frequency, and the rotor phase would eventually return to the equilibrium phase $\phi_E$.

Similarly, if the rotor began spinning faster than the nominal frequency, then the rotor phase would advance to $\phi_2$. With the rotor advanced to phase angle $\phi_2$, the net torque applied to the rotor would be a negative value $T_2$. Thus, the rotor would decelerate, thereby returning to the nominal rotation frequency, and returning to the equilibrium phase $\phi_E$.

The preceding analysis is based on a simple situation, but can be easily extended to more complex circumstances. For example, Fourier series methods can be used to extend the analysis to situations where: 1) the drive pressure waveform is non-sinusoidal; 2) the transfer coefficient waveform is non-sinusoidal; 3) the number of vanes does not equal the number of jets; 4) the vanes and/or jets are unequally spaced; and 5) the rotor speed is equal to a multiple (i.e. a harmonic or sub-harmonic) of the fundamental nominal speed. Furthermore, known numerical simulation methods may be used to give an exact treatment of: 1) aerodynamic flow effects; 2) turbulent flow; 3) effects of varying drag or mechanical load; 4) acoustical wave effects; and 5) non-periodic drive pressure waveforms. While variations in the specific design of the invention may lead to variations in behavior, the fundamental principle remains the same: the use of a particular time-varying fluid source to drive the periodic motion of an object results in stable equilibrium points at which deviations from a given rate of motion are met by a restorative force which maintains the rate of motion of the object at the stable equilibrium point.

Figure 7:
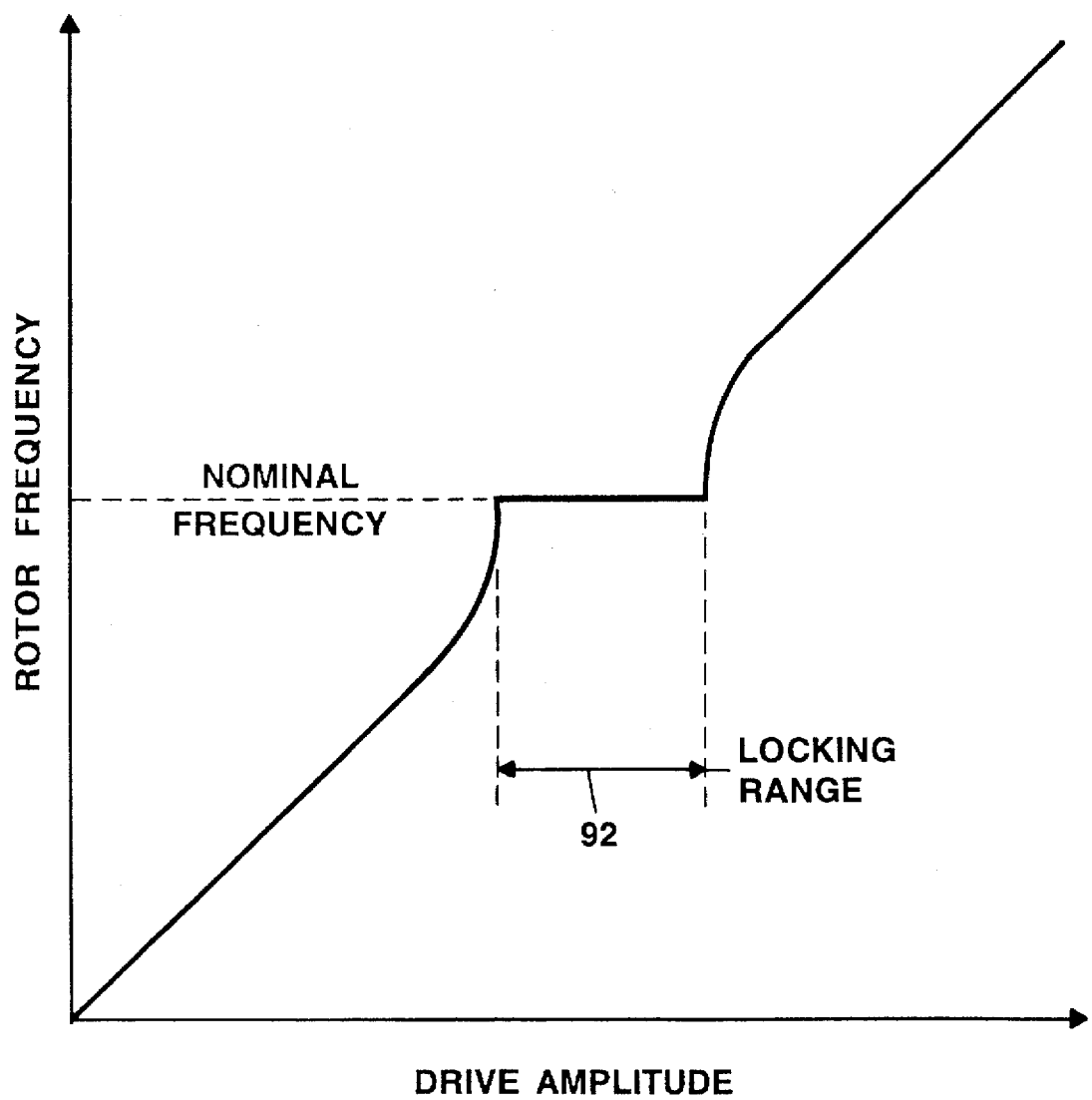
FIG. 7 is a plot of rotor frequency versus drive amplitude for a spectrometer according to the present invention.

Referring now to FIG. 7, a plot of rotor frequency vs. drive amplitude illustrates that within a range of drive amplitudes (here designated by reference character 92) the rotor frequency is held at the nominal rotation frequency. The vertical axis of the plot corresponds to rotor frequency. The horizontal axis of the plot, labeled "drive amplitude", corresponds to an amplitude of a drive force applied to the rotor to cause rotational motion of the rotor.

Figure 8:
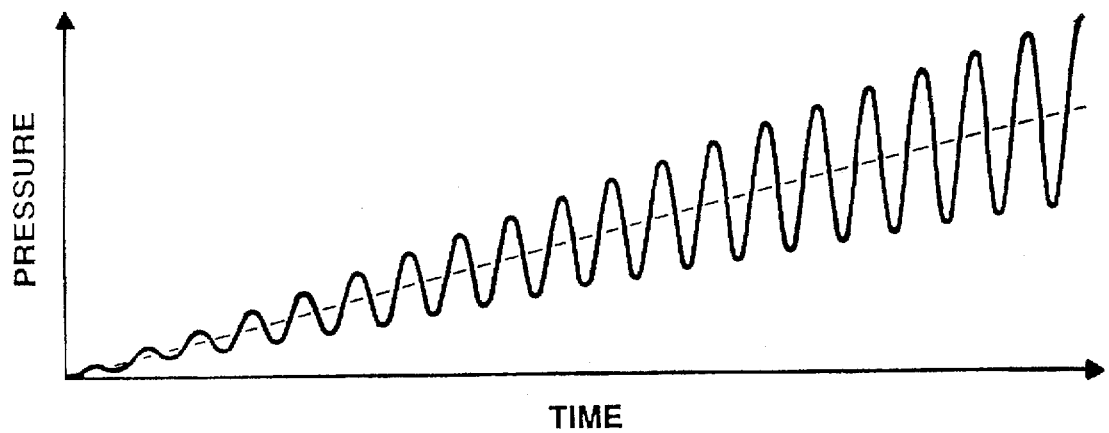
FIG. 8 is a plot of drive force versus time for a fluid pressure signal.

The plot of FIG. 7 shows that a rotor being driven by drive gas having increasing steady state pressure and a time-varying pressure component with an increasing amplitude (as shown in FIG. 8) has a characteristic range of pressure within which the rotor frequency is maintained or "locked" at a desired rotor frequency. Thus, the locking range 92 corresponds to the range of drive pressures over which the rotor will remain at the nominal frequency. The width of locking range 92 may vary in accordance with a variety of factors including, but not limited to, the angle of the drive jets, the shape of the rotor vanes and the equilibrium torque (i.e. the amount of drag on the rotor due to frictional forces or mechanical load on the rotor). Thus, as discussed above, the combination of the rotor torque response as a function of rotor rotation angle and a drive force having a time-varying amplitude component which may, for example, be provided as a sequence of drive gas pulses, produces a frequency locking effect which holds the rotor at a predetermined rotation frequency.

In the present invention, a frequency must be selected at which gas pulses are applied to the rotor end cap. One method of determining this frequency is to calculate it as a product of the desired rotor rotation frequency and a value referred to as a "least common multiple" (LCM). The LCM is the smallest number which may be evenly divided by both the number of gas jets and the number of end cap vanes. For example, in the case of an end cap having six vanes and a drive plate having six gas jets, the least common multiple (LCM) value is six. Thus, to spin the rotor at a frequency of 30 Hz, pulses of fluid are expelled through the gas jets at a frequency of 6×30 Hz or 180 Hz.

The smallest LCM value between two numbers results when the numbers are selected to be equal to each other. Consequently, selecting the number of gas jets equal to the number of end cap vanes results in the lowest fluid pulse repetition frequency for a predetermined end cap rotation frequency. The next lowest LCM value results from the number of vanes and the number of jets being related as one being the multiple of the other.

Figure 9A:
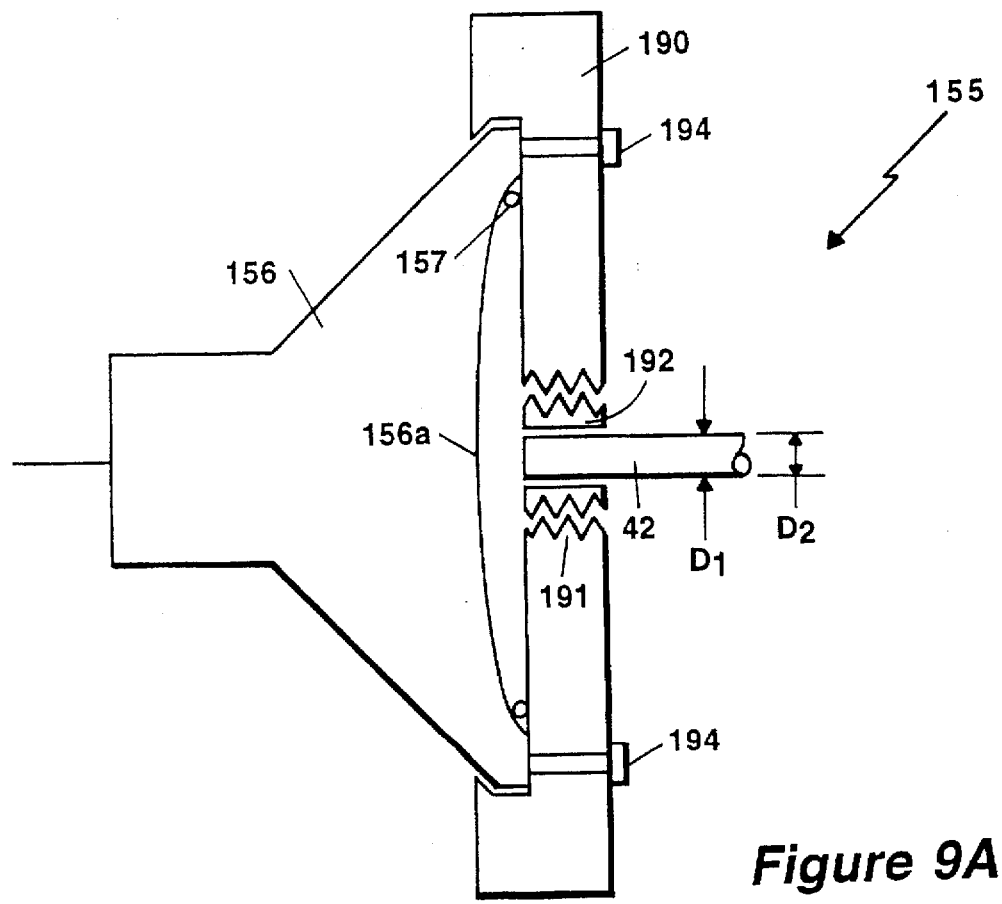
FIG. 9A is a cross-sectional side view of the loudspeaker/ pressure tube coupling of the spectrometer of FIG. 9.
Figure 9:
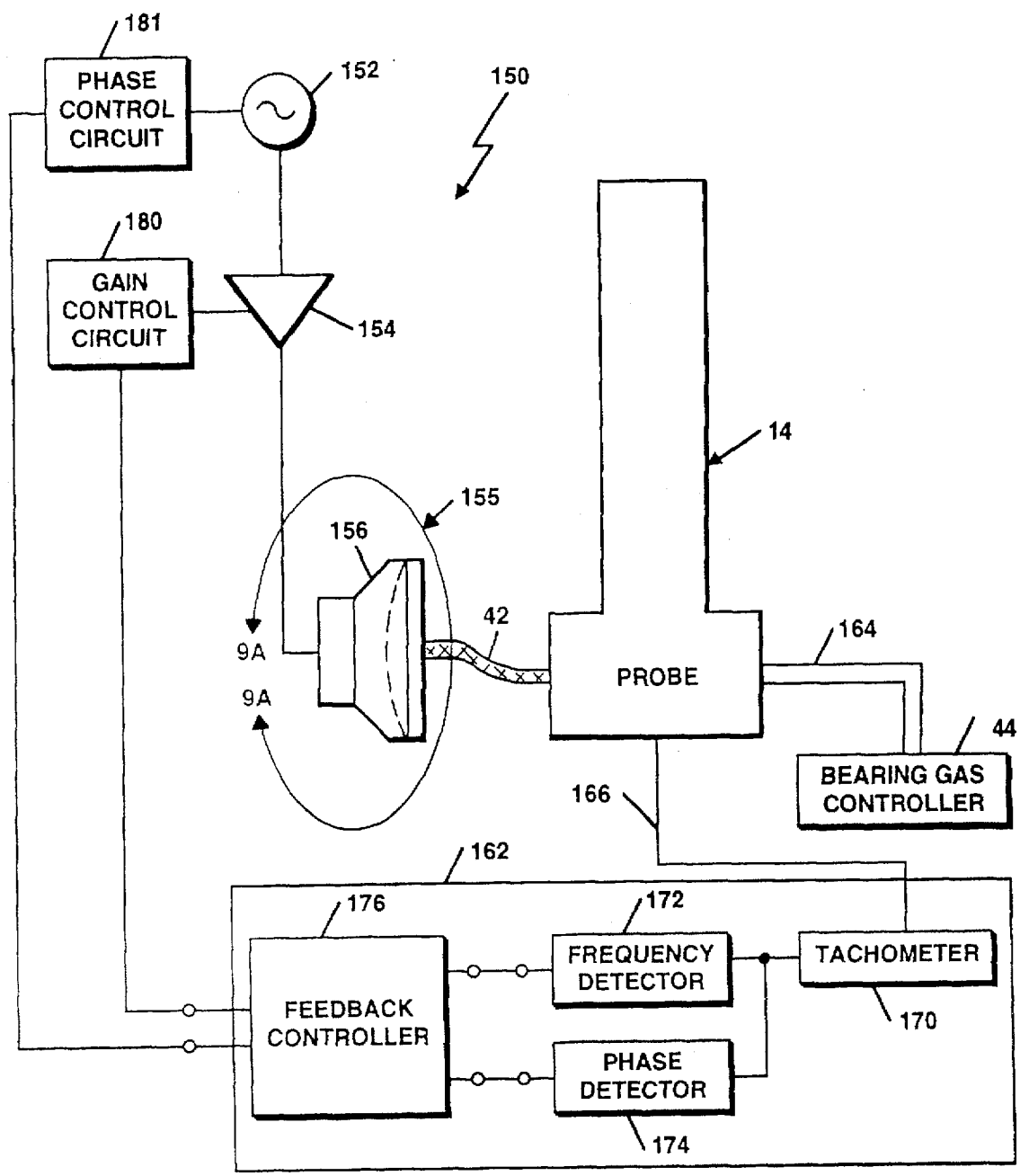
FIG. 9 is a block diagram of a NMR spectrometer according to the present invention having a rotor feedback circuit.

Referring now to FIGS. 9 and 9A, one form of pulse generator is demonstrated. An apparatus for performing a magic angle turning experiment 150 includes a signal source 152 having an output port coupled to an input port of a drive signal circuit 154. Signal source 152 may be, for example, a function generator which provides output signals at selectable frequencies and amplitudes. The signal source may be capable of providing a variety of waveforms including, but not limited to, sinusoidal waveforms, square waveforms, triangular waveforms, and the like. Signal source 152 feeds a signal having a time-varying amplitude to an input port of amplifier 154. For example, signal source 152 may provide a signal having a sinusoidal wave shape with a given amplitude at a predetermined frequency. The amplifier 154 receives the signal and provides a drive signal at an output terminal thereof. A control terminal of the amplifier is coupled to a gain control circuit 180, which provides an input signal that adjusts the gain provided by the amplifier 154. The gain control therefore allows the amplification to be easily controlled.

The output of amplifier 154 is coupled to an input port of a transducer assembly 155 which, in this particular embodiment, includes an audio loudspeaker 156. The amplified output signal is fed to an input port of the speaker 156, which converts the electrical signal to an acoustical wave. The acoustical wave is coupled into tube 42, and thereby takes the form of a controllable fluid pressure. The fluid pressure propagates through tube 42 to magic angle turning probe 14 (FIG. 1), where the tube 42 is coupled to a fluid input fitting of the probe 14.

Referring to FIG. 9A, transducer assembly 155 includes a speaker 156 having a cone shaped membrane 156a and a gasket 157. Speaker 156 is mounted to a plate 190 via screws or other fastening means, such that gasket 157 forms a gas tight seal to a first surface of plate 190. Plate 190 may be, for example, a material such as plastic having a thickness of about 6 mm.

Speaker membrane 156a vibrates in response to drive signals fed to the speaker, and a gas flow produced by movement of membrane 156a is forced through tube 42. In this particular embodiment, tube 42 is coupled to plate 190 via a tubing adapter 192, which is hermetically sealed about the circumference of the tube 42. External screw threads on tubing adapter 192 mate with a threaded aperture 191 in plate 190. Thus, in response to drive signals, the vibration of the membrane 156a causes pulses of gas, such as air, to be coupled into tube 42.

Although speaker 156 is shown mounted to a flat surface of plate 190, those skilled in the art will recognize that plate 190 could also have a horn shaped surface to provide a better acoustical coupling between speaker 156 and tube 42. Alternatively, or in addition to the horn shaped plate surface, a proximal end of tube 42 could have a tapered shape. Certain advantages might be gained by providing such tapering, since the pressure increases as an acoustical wave travels along a tube which is tapering down to a smaller cross-section. Furthermore, once the pressure wave enters probe 14, it may travel through different paths of varying diameter, such as tubes internal to the probe, and channels through the stator.

Referring again to FIG. 9, bearing gas module 44 provides a bearing gas to the probe 14. A controller 162 is also provided which includes a tachometer 170 that is coupled to probe 14 via signal line 166. The tachometer 170 measures the speed of rotation of the rotor, and provides a signal indicative thereof. The output signal of the tachometer 170 is received by a frequency detector 172 and a phase detector 174 which detect, respectively, the frequency and phase of the tachometer signal. This information is then provided to feedback controller 176, which signals the gain control circuit 180 in response to the tachometer feedback information to increase or decrease the gain as necessary. As shown in FIG. 9, a phase control circuit 181 is also provided, and may be used to control the relative phase of the signal output by the signal source 152 via feedback controller 176.

The rotor disposed in the probe 14 is driven by the airflow provided from the acoustic wave produced by the speaker 156. In a preferred embodiment, the air flow is a pulsating airflow at a constant pulse rate with each of the pulses having a constant pulse width. The pressure amplitude of the pulsating air flow is adjusted as needed to provide a stable equilibrium condition. When the system locks into the equilibrium condition, the rotor spins at a frequency proportional to the frequency of the pulsating airflow to provide a system having exceptional rotational stability.

Figure 10:
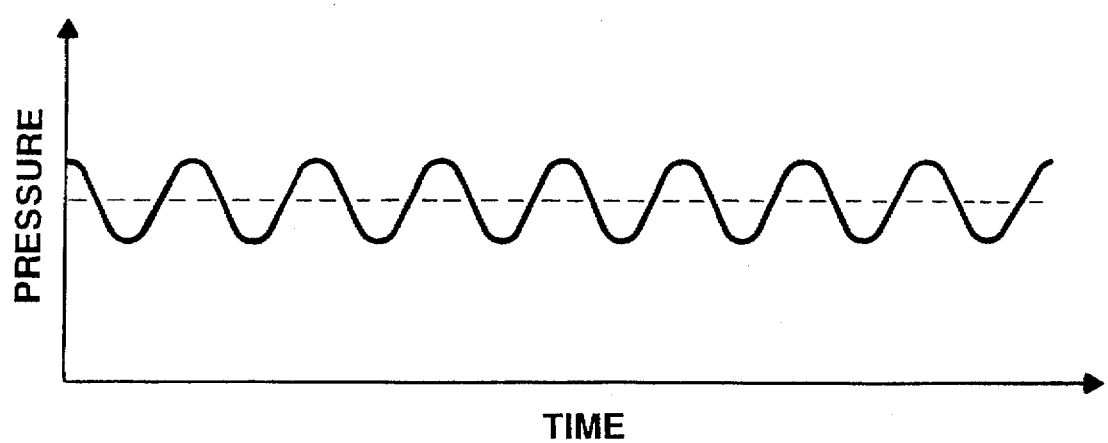
FIGS. 10–10B are a series of plots of drive signals used in describing the present invention.
Figure 10A:
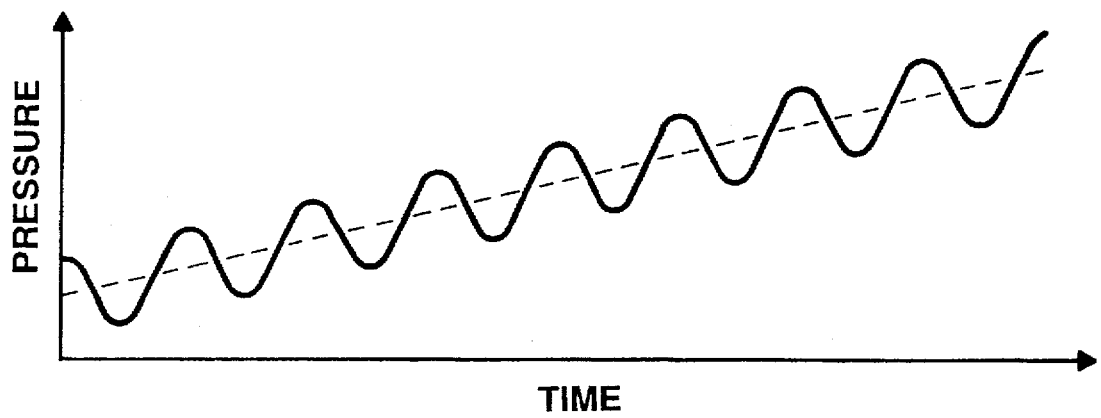
Figure 10B:
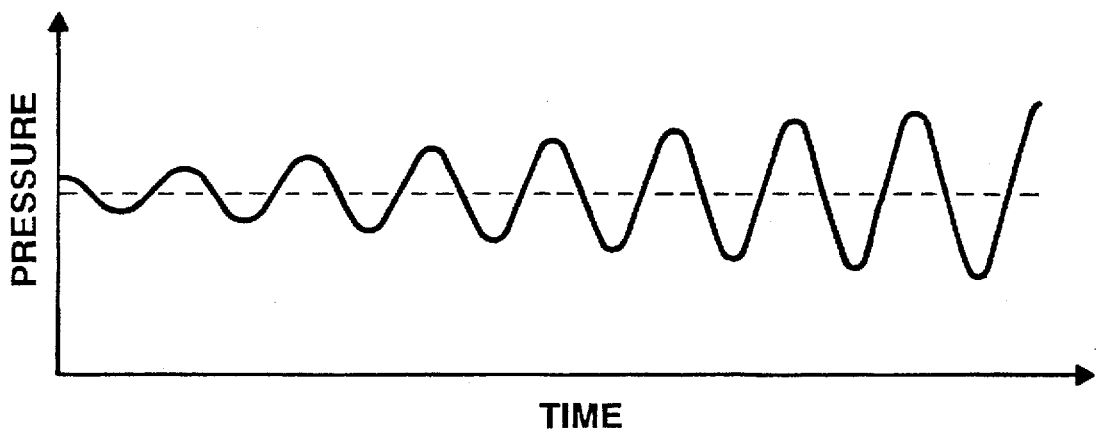

Referring now to FIGS. 10–10B, it can be seen that a plurality of different drive pressure waveforms may be used to produce the desired frequency locking effect. FIG. 10 shows a pressure waveform which may be used after a frequency lock has been achieved. FIGS. 10A–10B show pressure signal waveforms which may be used to locate pressure amplitudes at which a frequency lock may be achieved. For example, FIG. 10A illustrates that a steady state component of the drive pressure signal may be increased until a magnitude at which a frequency lock occurs is reached. It should be noted that, in FIG. 10A, peak-to-peak amplitude of the time-varying component of the drive pressure signal does not change. FIG. 10B, on the other hand, illustrates that the steady state component of the drive pressure signal may remain constant while the the peak-to-peak amplitude of the time-varying component of the drive pressure signal may be adjusted to locate an amplitude at which a frequency locking condition occurs. Once a frequency locking condition is found, however, (i.e., amplitude parameters are found which produce a frequency locking effect), the shape of the drive pressure signal may be similar to that as shown in FIG. 10.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. For example, the number of jets and the number of vanes used with a system according to the invention may be varied. However, many magic angle turning experiments conducted at relatively low sample spinning frequencies require three-fold symmetry. Thus, in some applications, it may be desirable to use a system which includes a drive plate having three jets and an end cap rotor having three vanes. With relatively few vanes on the end cap, there is a relatively large spacing between the vanes. Such relatively large vane spacing may improve the frequency locking behavior of the system.

Another variation of the present invention is its application to a non-rotary system. The use of a time-varying fluid pressure to drive a periodic system having a linear or otherwise non-rotary direction component could provide similar desired frequency locking effects.

What is claimed is:

1. A fluid drive apparatus for moving an object with a periodic motion having a first frequency, the apparatus comprising:

a fluid source generating a fluid flow having a time-varying magnitude which varies with a second frequency; and coupling apparatus for coupling the fluid flow to the object such that the object undergoes said periodic motion in response thereto, the coupling apparatus having a coupling characteristic which results in a frequency lock between the first frequency and the second frequency.

2. The apparatus of claim 1, wherein the periodic motion is rotational periodic motion.

3. The apparatus of claim 2, wherein the second frequency is proportional to the first frequency.

4. The apparatus of claim 3, wherein the object is a nuclear magnetic resonance rotor.

5. The apparatus of claim 3, wherein:

the rotor has a plurality of vanes around a circumference thereof;

said fluid source is provided as a gas source generating a gas flow; and the rotor is coupled to the gas flow by directing the gas flow toward the rotor such that the gas flow strikes the vanes of the rotor.

6. Apparatus for spinning a nuclear magnetic resonance rotor at a first frequency comprising:

a drive force generator for generating a drive force output having a time-varying amplitude which varies with a second frequency; and coupling apparatus for coupling the drive force output to the rotor such as to cause the rotor to spin at a second frequency, the coupling apparatus having a coupling characteristic which results in a frequency lock between the first frequency and the second frequency.

7. The apparatus of claim 6 wherein the drive force generator includes a fluid source for generating a gas flow having a time-varying pressure at an output port thereof.

8. The apparatus of claim 7 wherein the means for applying the drive force comprises:

a housing having a cavity region within which the rotor spins; and a fluid path having a first end coupled to the output port of the fluid source and a second end located proximate the rotor to deliver fluid from the fluid source to the rotor.

9. A probe for use in a nuclear magnetic resonance spectrometer, the probe comprising:

a stator housing;

a rotor disposed in said stator housing which is rotatable at a first frequency;

a rotor drive apparatus for providing, at an output port thereof, a drive force having an amplitude which varies as a function of time with a second frequency; and coupling apparatus for coupling the drive force from the output port of said rotor drive circuit to said rotor, the coupling apparatus having a coupling characteristic which results in a frequency lock between the first frequency and the second frequency.

10. The probe of claim 9 wherein said rotor drive apparatus comprises:

an electrical signal source generating an electrical output signal; and a transducer for receiving the electrical output signal and for providing a fluid pressure in response thereto.

11. The probe of claim 10 wherein said transducer comprises an audio loudspeaker.

12. The probe of claim 11 wherein the electrical signal source comprises:

a digital logic circuit generating a pulse waveshape which is present in the electrical output signal.

13. A spinner apparatus comprising:

a stator housing having a cavity region;

a rotor having a vane region supporting a plurality of vanes, said rotor disposed in the cavity region of said stator housing such that it is rotatable at a first frequency;

a plurality of drive gas jets provided in said stator housing, said plurality of drive gas jets disposed about said rotor, each of said plurality of gas jets having an aperture directed at the vane region of said rotor;

a fluid source generating a periodic fluid output with a time-varying magnitude which varies with a second frequency; and coupling apparatus for coupling the fluid output port to said plurality of drive gas jets, the coupling apparatus having a coupling characteristic which results in a frequency lock between the first frequency and the second frequency.

14. The apparatus of claim 13 wherein a total number of said plurality of vanes is a multiple of a total number of the plurality of drive gas jets.

15. Apparatus for spinning a sample in a nuclear magnetic resonance spectrometer at a first frequency, the apparatus comprising:

a stator housing;

a rotor rotatably coupled to said stator housing;

a rotor drive circuit for providing at an output port thereof a drive force having an amplitude which varies as a function of time at a second frequency;

coupling apparatus for coupling the drive force from the output port of said rotor drive circuit to said rotor, the coupling apparatus having a coupling characteristic which results in a frequency lock between the first frequency and the second frequency; and a feedback control circuit sensing at least one of a rotor rotation frequency and a rotor rotation phase, and for providing a feedback signal to said rotor drive circuit.

16. The apparatus of claim 15 wherein said feedback control circuit further comprises:

a tachometer sensing a rotation of the rotor and generating an output signal indicative thereof;

a frequency detector receiving the tachometer output signal and generating a frequency signal indicative of a rotation frequency of the rotor;

a phase detector receiving the tachometer output signal and generating a phase signal indicative of a rotation phase of the rotor; and a feedback controller detecting the frequency signal and the phase signal and providing said feedback signal to the rotor drive circuit which is indicative of at least one of the frequency signal and the phase signal.

17. A method for moving an object with a periodic motion having a first frequency, the method comprising:

generating a fluid flow having a time-varying magnitude which varies with a second frequency; and coupling the fluid flow to the object such that the object undergoes said periodic motion in response thereto and so the coupling results in a frequency lock between the first frequency and the second frequency.

18. The method of claim 17 wherein moving an object with a periodic motion comprises rotating a nuclear magnetic resonance spectrometer rotor.

19. The method of claim 18 wherein the second frequency is proportional to the first frequency.

20. The method of claim 17 wherein moving an object with a periodic motion comprises moving an object with a rotational periodic motion.

21. The method of claim 20 wherein the object has a plurality of vanes around a circumference thereof in a vane region of the object and wherein coupling the fluid flow to the object comprises directing the fluid flow toward the vane region of the object.

22. The method of claim 17 wherein generating a fluid flow with a time-varying magnitude comprises generating a fluid flow with a fluid source comprising an audio loudspeaker.

23. A method of rotating a nuclear magnetic resonance spectrometer rotor with a first frequency, the method comprising:

providing a stator housing having a cavity region;

providing said rotor with a plurality of vanes located around a circumference of the rotor in a vane region of the rotor, and locating the rotor in the cavity region of the stator housing;

providing a plurality of drive gas jets within the stator housing and directing the drive gas jets toward the vane region of said rotor;

generating a fluid output with a time-varying magnitude which varies at a second frequency; and coupling the fluid output to the plurality of drive gas jets such that the fluid contacts the vane region and the coupling results in a frequency lock between the first frequency and the second frequency.

* * * * *